United States Patent
Hyun et al.

(10) Patent No.: US 12,519,876 B2
(45) Date of Patent: Jan. 6, 2026

(54) DISPLAY DEVICE INCLUDING PRISM OVERLAPPING A HOLE AREA, AND CAMERA MODULE AND SUB-EMISSION AREA ADJACENT TO THE PRISM

(71) Applicant: Samsung Display Co., LTD., Yongin-si (KR)

(72) Inventors: Chang Ho Hyun, Yongin-si (KR); Changwoo Kahng, Yongin-si (KR); Woung Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 364 days.

(21) Appl. No.: 18/093,920

(22) Filed: Jan. 6, 2023

(65) Prior Publication Data
US 2023/0344925 A1    Oct. 26, 2023

(30) Foreign Application Priority Data
Apr. 25, 2022 (KR) .................. 10-2022-0051083

(51) Int. Cl.
| | | |
|---|---|---|
| H04M 1/02 | (2006.01) |
| H01L 25/075 | (2006.01) |
| H01L 33/46 | (2010.01) |
| H01L 33/58 | (2010.01) |
| H01L 33/62 | (2010.01) |
| H10H 20/841 | (2025.01) |
| H10H 20/855 | (2025.01) |
| H10H 20/857 | (2025.01) |

(52) U.S. Cl.
CPC ...... *H04M 1/0264* (2013.01); *H01L 25/0753* (2013.01); *H10H 20/841* (2025.01); *H10H 20/855* (2025.01); *H10H 20/857* (2025.01)

(58) Field of Classification Search
CPC ............. H04M 1/0264; H01L 25/0753; H10H 20/841; H10H 20/855; H10H 20/857
See application file for complete search history.

(56) References Cited

U.S. PATENT DOCUMENTS

| | | | | |
|---|---|---|---|---|
| 2020/0320959 | A1* | 10/2020 | Ryu | ...................... G09G 3/3275 |
| 2020/0333512 | A1* | 10/2020 | Xiang | ....................... G02B 5/06 |
| 2020/0373372 | A1* | 11/2020 | Chung | ............... H10K 59/8792 |
| 2021/0296420 | A1* | 9/2021 | Bok | ....................... H10K 59/121 |
| 2021/0311372 | A1* | 10/2021 | Jeong | ................. G02B 13/0065 |
| 2022/0052125 | A1* | 2/2022 | Choi | ....................... H10K 50/844 |

FOREIGN PATENT DOCUMENTS

| | | |
|---|---|---|
| JP | 2006350181 A | 12/2006 |
| KR | 1020190129663 | 11/2019 |
| KR | 1020200135637 | 12/2020 |
| KR | 1020210116832 | 9/2021 |

\* cited by examiner

*Primary Examiner* — Tracie Y Green
(74) *Attorney, Agent, or Firm* — CANTOR COLBURN LLP

(57) ABSTRACT

A display device includes: a substrate including a main area and a sub-area overlapping each other; a plurality of light-emitting devices positioned on the main area and the sub-area of the substrate; a prism positioned between the main area and the sub-area; and a camera module positioned on one surface of the prism.

20 Claims, 14 Drawing Sheets

DISPLAY DEVICE INCLUDING PRISM OVERLAPPING A HOLE AREA, AND CAMERA MODULE AND SUB-EMISSION AREA ADJACENT TO THE PRISM

This application claims priority to Korean Patent Application No. 10-2022-0051083, filed on Apr. 25, 2022, and all the benefits accruing therefrom under 35 U.S.C. § 119, the content of which in its entirety is herein incorporated by reference.

BACKGROUND

1. Field

The present disclosure relates to a display device.

2. Description of the Related Art

A display device is a device for displaying an image, and includes a liquid crystal display ("LCD"), an organic light emitting diode ("OLED") display, and the like. The display device is used in various electronic devices such as a mobile phone, a navigation device, a digital camera, an electronic book, a portable game machine, and various terminals. The use of these electronic devices is being integrated, and for example, a camera may be built in a portable phone.

In this case, an opening may be formed in some areas of the display device of the portable phone to embed a camera or the like in the portable phone. In this case, a part of the pixel may be removed to improve transmittance in the opening area. Due to this, the resolution in the opening area is lowered, a residual film and impurity are generated in a large amount, thereby increasing the defect rate of the device, and there is a limit in improving the transmittance.

SUMMARY

Embodiments are to provide a display device capable of preventing an occurrence of defects in devices while improving the transmittance in the opening area.

A display device according to an embodiment includes: a substrate including a main area and a sub-area overlapping each other; a plurality of light-emitting devices positioned on the main area and the sub-area of the substrate; a prism positioned between the main area and the sub-area; and a camera module positioned on one surface of the prism.

The substrate further may include: a hole area defined in the main area; and a sub-emission area positioned in the sub-area, and first light-emitting devices positioned on the sub-area among the plurality of light-emitting devices may overlap the hole area.

In the sub-area, the first light-emitting device may be positioned only within the sub-emission area.

Second light-emitting devices positioned on the main area among the plurality of light-emitting devices may not be positioned in the hole area.

The display device according to an embodiment may further include: a transistor connected to each of the plurality of light-emitting devices, and the transistor and each light-emitting device may include a plurality of metal layers and a plurality of insulating layers positioned between a plurality of metal layers.

A plurality of metal layers and a plurality of insulating layers may not be positioned in the hole area.

A plurality of metal layers and a plurality of insulating layers may not be positioned in the sub-area except for the sub-emission area.

Second light-emitting devices positioned in the main area among the plurality of light-emitting devices and the first light-emitting devices positioned in the sub-area may be simultaneously formed in the same process, and the transistor positioned in the main area and the transistor positioned in the sub-area may be simultaneously formed in the same process.

A density of the second light-emitting devices positioned in the main area and a density of the first light-emitting devices positioned in the sub-area may be the same.

The prism may include a first prism and a second prism, the first prism and the second prism may each include a first surface, a second surface, and an inclined surface, and the inclined surface of the first prism and the inclined surface of the second prism may be disposed to face each other.

The first surface of the first prism may be adjacent to the sub-area except for the sub-emission area, and the second surface of the first prism may be adjacent to the sub-emission area.

The first surface of the second prism may be adjacent to the main area of the substrate, and the second surface of the second prism may be adjacent to the camera module.

The display device according to an embodiment may further include a coating layer positioned between the first prism and the second prism.

The coating layer may include: a first coating layer positioned on the inclined surface of the first prism, and a second coating layer positioned on the inclined surface of the second prism.

The coating layer may include a reflective metal material.

When the first light-emitting devices positioned in the sub-emission area are turned off and the camera module is turned on, light incident on the hole area may pass through the prism and be incident on the camera module.

When the first light-emitting devices positioned in the sub-emission area is turned on and the camera module is turned off, light emitted from the first light-emitting devices may pass sequentially through the prism and the hole area.

The prism may include a first surface, a second surface, and an inclined surface, the first surface of the prism may be adjacent to the sub-area except for the sub-emission area, the second surface of the prism may be adjacent to the sub-emission area, and the inclined surface of the prism may face the main area and the camera module.

The prism may include a first surface, a second surface, and an inclined surface, the first surface of the prism may be adjacent to the main area of the substrate, the second surface of the prism may be adjacent to the camera module, and the inclined surface of the prism may face the sub-area.

The substrate may include a hole area defined within the main area and a sub-emission area positioned within the sub-area, the camera module may overlap the hole area, and the sub-emission area may be positioned adjacent to a lower side of the prism. According to embodiments, it is possible to improve the transmittance in the opening area of the display device, and it is possible to effectively prevent the occurrence of defects in the device.

DETAILED DESCRIPTION

Figure 1:
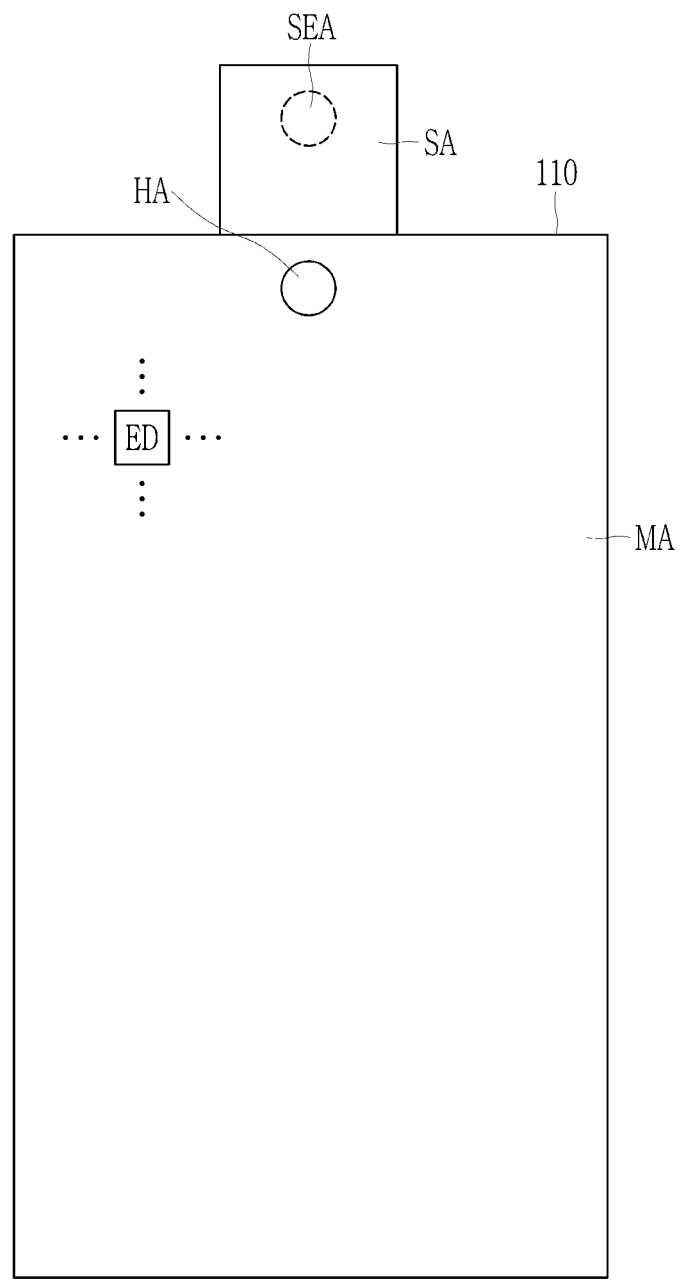
FIG. 1 and FIG. 2 are schematic top plan views of a display device according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

Descriptions of parts not related to the present invention are omitted, and like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses. In the drawings, the thickness of layers, films, panels, areas, etc., are exaggerated for clarity. In the drawings, for better understanding and ease of description, the thicknesses of some layers and areas are exaggerated.

It will be understood that when an element such as a layer, film, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Figure 2:
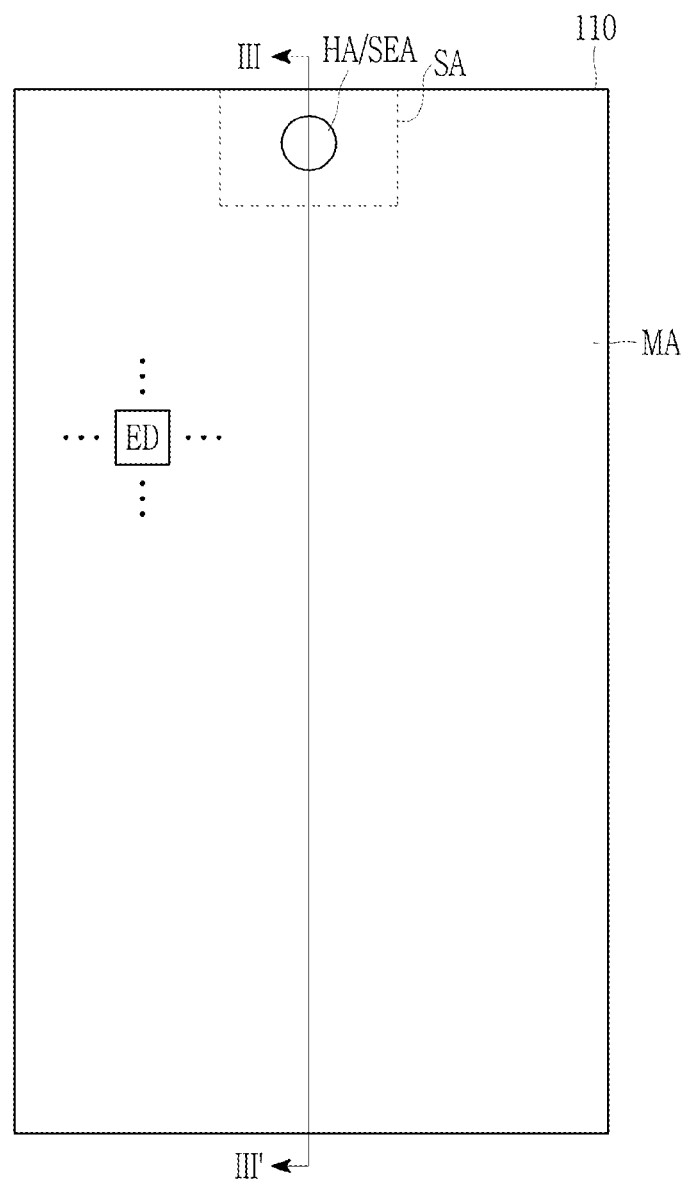

Further, in the specification, the phrase "plan view" means a view the object portion from the top (e.g., FIGS. 1 and 2 are the plan views), and the phrase "on a cross-section" means viewing a cross-section of which the object portion is vertically cut from the side. FIGS. 3, 5-6, 8, 10, 12 and 14 are cross-sectional views.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Hereinafter, a display device according to an embodiment is described with reference to FIG. 1 to FIG. 5.

Figure 3:
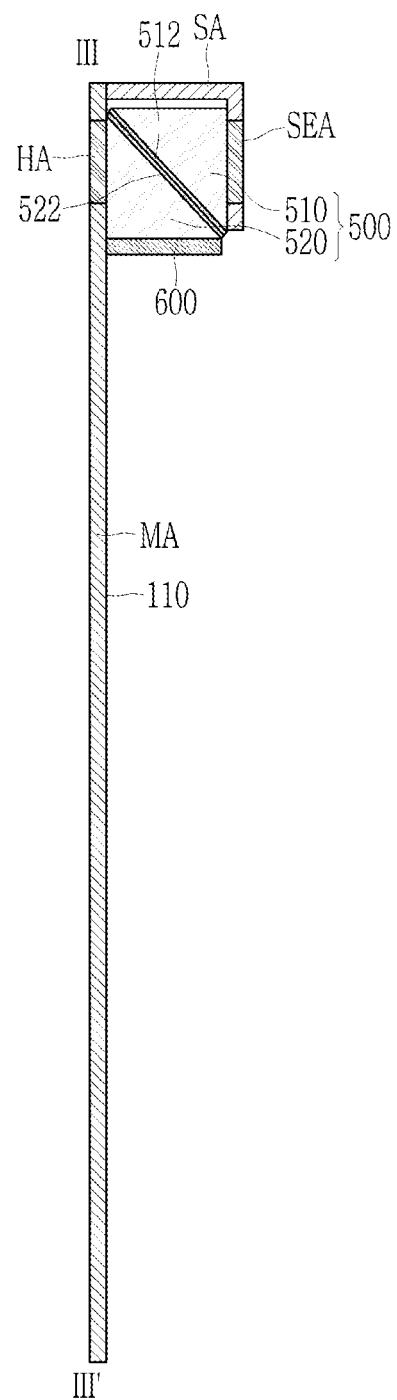
FIG. 3 is a schematic cross-sectional view of a display device according to an embodiment taken along line of FIG. 2.
Figure 4:
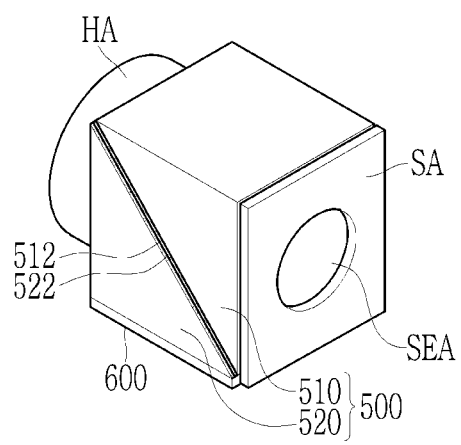
FIG. 4 is a perspective view showing some areas of a display device according to an embodiment.
Figure 5:
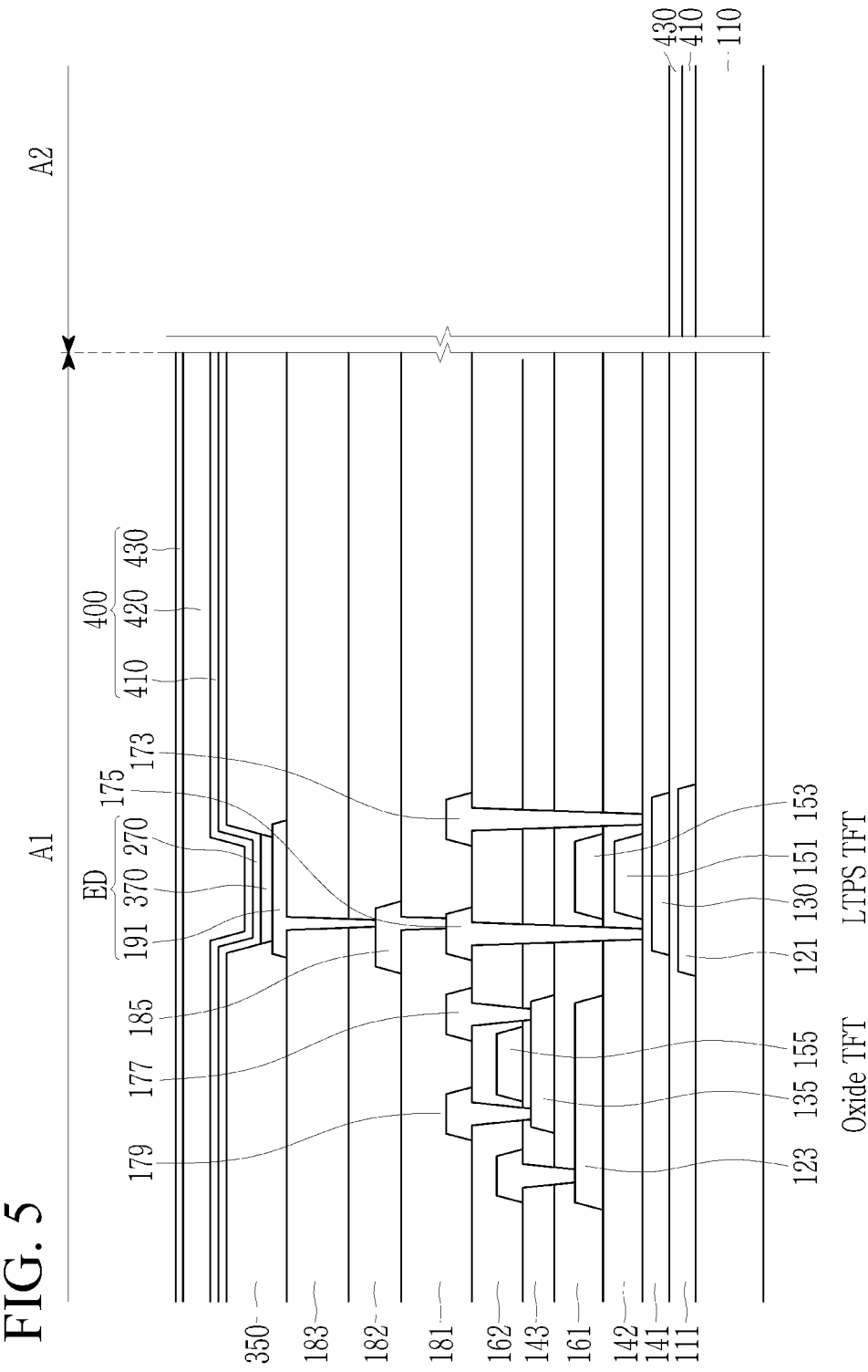
FIG. 5 is a cross-sectional view showing some areas of a display device according to an embodiment.

FIG. 1 and FIG. 2 are schematic top plan views of a display device according to an embodiment. FIG. 1 shows the state before some areas of the substrate are bent, and FIG. 2 shows the state in which some areas of the substrate are bent. FIG. 3 is a schematic cross-sectional view of a display device according to an embodiment taken along line of FIG. 2. FIG. 4 is a perspective view showing some areas of a display device according to an embodiment, and FIG. 5 is a cross-sectional view showing some areas of a display device according to an embodiment.

First, as shown in FIG. 1 to FIG. 4, the display device according to an embodiment includes a substrate 110 including a main area MA and a sub-area SA, a plurality of light-emitting devices ED positioned on the substrate 110, a prism 500 positioned between the main area MA and the sub-area SA of the substrate 110, and a camera module 600 positioned on one surface of the prism 500.

The substrate 110 may be divided into the main area MA and the sub-area SA. The main area MA of the substrate 110 may be approximately quadrangle in a plan view. The substrate 110 may further include a hole area HA defined within the main area MA. For example, the hole area HA may be substantially circular in a plan view. The sub-area SA of the substrate 110 may be positioned so as to be in contact with one edge of main area MA. In the state before bending the substrate 110, the sub-area SA may be formed of a shape protruded from one edge of the main area MA. In the state that the substrate 110 is bent, the sub-area SA may be positioned on the rear of the main area MA. The sub-area SA may overlap the main area MA in a plan view. The sub-area SA of the substrate 110 may be approximately quadrangle in a plan view. The substrate 110 may further include a sub-emission area SEA positioned within the sub-area SA. When the substrate 110 is bent, the sub-emission area SEA may overlap hole area HA in a plan view. Light from the sub-emission area SEA may pass through the hole area HA. The shape of the sub-emission area SEA may correspond to the shape of the hole area HA, and the size of the sub-emission area SEA may correspond to the size of the hole area HA. For example, the shape of the sub-emission area SEA may be substantially the same as the shape of the hole area HA. In addition, the size of the sub-emission area SEA may be substantially the same as the size of the hole area HA.

The sub-area SA may be relatively small compared to the main area MA. Accordingly, the sub-area SA may be covered by the main area MA. The main area MA and the sub-area SA each refer to a partial area of one substrate 110, and may be formed integrally. However, the present invention is not limited thereto, and the main area MA and the sub-area SA may be separated from each other and may be connected by a separate member in another embodiment.

A plurality of light-emitting devices ED may be positioned on the main area MA and sub-area SA of the substrate 110, respectively. In the main area MA, the light-emitting device ED may be positioned in most parts except the hole area HA. However, a driving unit for driving the light-emitting device ED and a signal supply line for supplying a predetermined signal may be positioned at the edge of the main area MA, and the light-emitting device ED may not be positioned in the corresponding area. In the sub-area SA, the light-emitting device ED may be positioned only in the sub-emission area SEA. That is, the light-emitting device ED may not be positioned in an area positioned outside the sub-emission area SEA in the sub-area SA. When the substrate 110 is bent, the main area MA and the sub-area SA may overlap with each other, and the sub-emission area SEA may overlap the hole area HA in a plan view. Accordingly, the light emitted from the light-emitting device ED positioned in the sub-emission area SEA may pass through the hole area HA and be emitted to the outside.

In this case, the luminance of the light emitted from the light-emitting device ED positioned in the sub-emission area SEA may be different from the luminance of the light emitted from the light-emitting device ED positioned in the main area MA. The luminance of the light emitted from the light-emitting device ED positioned in the sub-emission area SEA may decrease while passing through the prism 500 and the hole area HA. Accordingly, the luminance of the light emitted from the light-emitting device ED positioned in the sub-emission area SEA may be relatively lower than the luminance of the light emitted from the light-emitting device ED positioned in the main area MA. Considering this, by adjusting the signal applied to the light-emitting device ED positioned in the sub-emission area SEA, it is possible to effectively prevent luminance deterioration.

On the main area MA and the sub-area SA of the substrate 110, a plurality of light-emitting devices ED may be disposed in a predetermined shape. For example, a plurality of light-emitting devices ED may be disposed along the row direction and the column direction in FIG. 2. However, this is only an example, and the arrangement form of the light-emitting device ED may be variously changed. The light-emitting device ED may emit light, for example, red, green, and blue, or white. The display device may display a predetermined image through light emitted from the light-emitting device ED.

The density of the light-emitting devices ED positioned in the main area MA may be similar to the density of the light-emitting devices ED positioned in the sub-area SA. In this case, the density of the light-emitting devices ED refers to the size or number of the light-emitting devices ED positioned per unit area. The density of the light-emitting devices ED positioned in the main area MA may be substantially the same as the density of the light-emitting devices ED positioned in the sub-area SA. Accordingly, the density of a plurality of light-emitting devices ED positioned on the substrate 110 may be uniform as a whole, and it is possible to effectively prevent the resolution from being lowered in some areas.

The prism 500 may be positioned between the main area MA and the sub-area SA of the substrate 110, and may be surrounded by the substrate 110. The prism 500 is a projection made by cutting a material such as glass with a precise angle and plane, and may disperse the light incident to the prism 500. The prism 500 may include a first prism 510 and a second prism 520. For example, the first prism 510 and the second prism 520 may each have a shape such as a triangular prism. In this case, the cross-section of the first prism 510 and the second prism 520 may be formed as a right triangle. However, this is only an example, and the shape of the prism 500 may be variously changed.

The inclined surface of the first prism 510 and the inclined surface of the second prism 520 may be positioned to face each other. Two surfaces of the first prism 510 may be disposed to be adjacent to the sub-area SA of the substrate 110. In this case, the two surfaces of the first prism 510 may form a right angle with each other. One of the two surfaces of the first prism 510 may be adjacent to the sub-emission area SEA of the sub-area SA, and the other may be adjacent to the sub-area SA excluding the sub-emission area SEA. One surface of the second prism 520 may be disposed to be adjacent to the main area MA of the substrate 110. In this case, one surface of the second prism 520 may be adjacent to the hole area HA defined in the main area MA of the substrate 110. The other surface of the second prism 520 may be adjacent to the camera module 600. At this time, one surface and the other surface of the second prism 520 may form a right angle with each other.

The main area MA and the sub-area SA of the substrate 110 facing each other with the prism 500 interposed therebetween may be disposed side by side. In addition, the surface of the first prism 510 adjacent to the sub-emission area SEA and the surface of the second prism 520 adjacent to the main area MA may be parallel to each other. The light emitted from the light-emitting device ED positioned in the sub-emission area SEA may pass through the first prism 510 and the second prism 520 and then pass through the hole area HA. In addition, the light incident to the hole area HA may be reflected from the inclined surface of the second prism 520 and transmitted to the camera module 600.

The display device according to an embodiment may further include coating layers 512 and 522 positioned between the first prism 510 and the second prism 520. The coating layers 512 and 522 may be formed of a reflective metal material such as chromium (Cr). The coating layers 512 and 522 may include a first coating layer 512 and a second coating layer 522. The first coating layer 512 may be positioned on the inclined surface of the first prism 510, and the second coating layer 522 may be positioned on the inclined surface of the second prism 520. For example, after the first coating layer 512 is formed on the first prism 510 and the second coating layer 522 is formed on the second prism 520, the first coating layer 512 and the second coating layer 522 may be positioned to face each other, and then the first prism 510 and the second prism 520 may be bonded by using an adhesive member. It has been described above that two coating layers 512 and 522 are positioned between the first prism 510 and the second prism 520, but the invention is not limited thereto. The display device according to another embodiment may include only one of two coating layers 512 and 522. That is, only one of the first coating layer 512 and the second coating layer 522 may be positioned between the first prism 510 and the second prism 520.

The camera module 600 may be positioned below the prism 500. The camera module 600 is an optical device for taking pictures, and an external subject may be photographed through the light that is incident through the hole area HA and reflected by the prism 500. Although it has been described that the camera module 600 is positioned under the prism 500, the invention is not limited thereto, and another electronic device may be positioned instead. For example, the display device according to an embodiment may include various sensors capable of sensing heat or light instead of the camera module 600.

Next, as shown in FIG. 5, the display device according to an embodiment may include a polycrystalline transistor LTPS TFT, an oxide transistor Oxide TFT, etc. positioned on the substrate 110, and the cross-section structure thereof is described. However, this cross-section structure is only one example, and the cross-section structure of layers included in the display device according to an embodiment may be variously changed. In FIG. 5, it is divided into two areas, that is, a first area A1 and a second area A2. In this case, the first area A1 is a portion where the light-emitting device ED is positioned, and means a portion of the main area MA except for the hole area HA and the sub-emission area SEA of the sub-area SA. The second area A2 is a part where the light-emitting device ED is not positioned, and refers to the hole area HA of the main area MA and the sub-area SA excluding the sub-emission area SEA.

The substrate 110 may include at least one among polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may be a rigid substrate or a flexible substrate capable of bending, folding, rolling, etc. The substrate 110 may be single-layered or multi-layered. The substrate 110 may have a structure in which at least one base layer and at least one inorganic layer, including a polymer resin sequentially stacked, are alternately stacked.

A first blocking member 121 may be positioned on the substrate 110. The first blocking member 121 may include a metal or a metal alloy such as copper (Cu), molybdenum (Mo), aluminum (Al), titanium (Ti), and may additionally include amorphous silicon. The first blocking member 121 may have a single-layered or multi-layered structure.

A buffer layer 111 may be positioned on the substrate 110 and the first blocking member 121. The buffer layer 111 may have single-layered or multi-layered structure. The buffer layer 111 may include an inorganic insulating material or an organic insulating material such as a silicon nitride (SiNx), a silicon oxide (SiOx), or a silicon oxynitride (SiOxNy). The buffer layer 111 may be omitted in some cases. In addition, a barrier layer may be further positioned between the substrate 110 and the buffer layer 111. The barrier layer may have a single-layered or multi-layered structure. The barrier layer may include an inorganic insulating material such as a silicon nitride (SiNx), a silicon oxide (SiOx), or a silicon oxynitride (SiOxNy).

A polycrystalline semiconductor layer including the semiconductor 130 of the polycrystalline transistor LTPS TFT may be positioned on the buffer layer 111. The semiconductor 130 of the polycrystalline transistor LTPS TFT may overlap the first blocking member 121 in a plan view. The semiconductor 130 of the polycrystalline transistor LTPS TFT may include a first area, a channel, and a second area.

The first area and the second area may be positioned on both sides of the channel of the semiconductor 130 of the polycrystalline transistor LTPS TFT, respectively. The semiconductor 130 of the polycrystalline transistor LTPS TFT may include a semiconductor material such as polysilicon.

A first gate insulating layer 141 may be positioned on the polycrystalline semiconductor layer including the semiconductor 130 of the polycrystalline transistor LTPS TFT. The first gate insulating layer 141 may have a single-layered or multi-layered structure. The first gate insulating layer 141 may include an inorganic insulating material such as a silicon nitride (SiNx), a silicon oxide (SiOx), or a silicon oxynitride (SiOxNy).

A first gate conductive layer including a gate electrode 151 of the polycrystalline transistor LTPS TFT may be positioned on the first gate insulating layer 141. The gate electrode 151 of the polycrystalline transistor LTPS TFT may overlap the channel of the semiconductor 130 in a plan view. The first gate conductive layer may have a single-layered or multi-layered structure. The first gate conductive layer may include a metal material such as molybdenum (Mo), aluminum (Al), copper (Cu), and/or titanium (Ti).

After forming the first gate conductive layer, a doping process or plasma treatment may be performed. The part of the polycrystalline semiconductor layer covered by the first gate conductive layer is not doped or plasma-treated, and the part of the polycrystalline semiconductor layer that is not covered by the first gate conductive layer is doped or plasma-treated, so it may have the same characteristics as a conductor. The doping process of the polycrystalline semiconductor layer may be performed with a p-type dopant, and the polycrystalline transistor LTPS TFT including the polycrystalline semiconductor layer may have a p-type transistor characteristic.

A second gate insulating layer 142 may be positioned on the first gate conductive layer of the gate electrode 151 of the polycrystalline transistor LTPS TFT. The second gate insulating layer 142 may have a single-layered or multi-layered structure. The second gate insulating layer 142 may have an inorganic insulating material such as a silicon nitride (SiNx), a silicon oxide (SiOx), or a silicon oxynitride (SiOxNy).

A second gate conductive layer including a storage electrode 153 may be positioned on the second gate insulating layer 142. The second gate conductive layer may have a single-layered or multi-layered structure. The second gate conductive layer may include a metal material such as molybdenum (Mo), aluminum (Al), copper (Cu), and/or titanium (Ti). The storage electrode 153 may overlap the gate electrode 151 of the polycrystalline transistor LTPS TFT to form a storage capacitor. A second blocking member 123 may be further positioned on the second gate insulating layer 142, and the second blocking member 123 may overlap the semiconductor 135 of the oxide transistor (Oxide TFT) in a plan view, which is described later.

A first interlayer insulating layer 161 may be positioned on the second gate conductive layer including the storage electrode 153 and the second blocking member 123. The first interlayer insulating layer 161 may have a single-layered or multi-layered structure. The first interlayer insulating layer 161 may have an inorganic insulating material such as a silicon nitride (SiNx), a silicon oxide (SiOx), or a silicon oxynitride (SiOxNy).

An oxide semiconductor layer including the semiconductor 135 of the oxide transistor Oxide TFT may be positioned on the first interlayer insulating layer 161. The semiconductor 135 of the oxide transistor Oxide TFT may include a first area, a channel, and a second area. The first area and the second area may be positioned on both sides of the channel of the semiconductor 135 of the oxide transistor oxide TFT, respectively. The semiconductor 135 of the oxide transistor oxide TFT may include an oxide semiconductor material.

The oxide semiconductor layer may include at least one among a primary metal oxide such as indium (In) oxide, tin (Sn) oxide, or zinc (Zn) oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. For example, the oxide semiconductor layer may include Indium-Gallium-Zinc Oxide ("IGZO") among In—Ga—Zn-based oxides.

A third gate insulating layer 143 may be positioned on the oxide semiconductor layer including the semiconductor 135 of the oxide transistor Oxide TFT. The third gate insulating layer 143 may be positioned on the entire surface of the oxide semiconductor layer and the first interlayer insulating layer 161. Accordingly, the third gate insulating layer 143 may cover the upper surface and the side surface of the semiconductor 135 of the oxide transistor Oxide TFT. However, the present embodiment is not limited thereto, and the third gate insulating layer 143 may not be positioned on the entire surface on the oxide semiconductor layer and the first interlayer insulating layer 161 in another embodiment. For example, the third gate insulating layer 143 may overlap the channel of the oxide transistor oxide TFT and not overlap the first area and the second area in a plan view. The third gate insulating layer 143 may have an inorganic insulating material such as a silicon nitride (SiNx), a silicon oxide (SiOx), or a silicon oxynitride (SiOxNy).

A third gate conductive layer including a gate electrode 155 of the oxide transistor Oxide TFT may be positioned on the third gate insulating layer 143. The gate electrode 155 of the oxide transistor Oxide TFT may overlap the channel of the semiconductor 135 in a plan view. The third gate conductive layer may have a single-layered or multi-layered structure. The third gate conductive layer may include a metal material such as molybdenum (Mo), aluminum (Al), copper (Cu), and/or titanium (Ti).

After forming the third gate conductive layer, a doping process or plasma treatment can be performed. The part of the oxide semiconductor layer covered by the third gate conductive layer is not doped or plasma-treated, and the part of the oxide semiconductor layer that is not covered by the third gate conductive layer is doped or plasma-treated, so it may have the same characteristics as a conductor. The doping process of the oxide semiconductor layer may be performed with an n-type dopant, and the oxide transistor TFT including the oxide semiconductor layer may have an n-type transistor characteristic.

A second interlayer insulating layer 162 may be positioned on the third gate conductive layer including the gate electrode 1155 of the oxide transistor Oxide TFT. The second interlayer insulating layer 162 may have a single-layered or multi-layered structure. The second interlayer insulating layer 162 may have an inorganic insulating material such as a silicon nitride (SiNx), a silicon oxide (SiOx), or a silicon oxynitride (SiOxNy).

A first data conductive layer including a source electrode 173 and a drain electrode 175 of the polycrystalline transistor LTPS TFT, and a source electrode 177 and a drain electrode 179 of the oxide transistor Oxide TFT may be positioned on the second interlayer insulating layer 162. The first data conductive layer may have a single-layered or multi-layered structure. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu). The first data conductive layer may have a triple-layer structure of a lower layer including a refractory metal such as molybdenum, chromium, tantalum, and titanium, or an alloy thereof, an intermediate film including an aluminum-based metal, a silver-based metal, and a copper-based metal with low resistivity, and an upper layer including a refractory metal such as molybdenum chromium, tantalum, and titanium.

The second interlayer insulating layer 162, the third gate insulating layer 143, the first interlayer insulating layer 161, the second gate insulating layer 142, and the first gate insulating layer 141 may define openings overlapping the source electrode 173 of the polycrystalline transistor LTPS TFT and the first area of the semiconductor 130 in a plan view. The source electrode 173 of the polycrystalline transistor LTPS TFT may be connected to the first area of the semiconductor 130 through the opening. Also, the second interlayer insulating layer 162, the third gate insulating layer 143, the first interlayer insulating layer 161, the second gate insulating layer 142, and the first gate insulating layer 141 may define openings overlapping the drain electrode 175 of the polycrystalline transistor LTPS TFT and the second area of the semiconductor 130 in a plan view. The drain electrode 175 of the polycrystalline transistor LTPS TFT may be connected to the second area of the semiconductor 130 through the opening. Accordingly, the above-described semiconductor 130, gate electrode 151, source electrode 173, and drain electrode 175 may constitute the polycrystalline transistor LTPS TFT. According to an embodiment, the polycrystalline transistor LTPS TFT may include only the first area and the second area of the semiconductor 130 instead of the source electrode 173 and the drain electrode 175.

The second interlayer insulating layer 162 and the third gate insulating layer 143 may define openings overlapping the source electrode 177 of the oxide transistor Oxide TFT and the first area of the semiconductor 135 in a plan view. The source electrode 177 of the oxide transistor oxide TFT may be connected to the first area of the semiconductor 135 through the opening. In addition, the second interlayer insulating layer 162 and the third gate insulating layer 143 may define openings overlapping the drain electrode 179 of the oxide transistor oxide TFT and the second area of the semiconductor 135 in a plan view. The drain electrode 179 of the oxide transistor oxide TFT can be connected to the second area of the semiconductor 135 through the opening. Accordingly, the aforementioned semiconductor 135, gate electrode 155, source electrode 177, and drain electrode 179 may constitute an oxide transistor Oxide TFT. According to an embodiment, the oxide transistor oxide TFT may include only the first area and the second area of the semiconductor 135 instead of the source electrode 177 and the drain electrode 179.

A first passivation layer 181 may be positioned on the first data conductive layer including the source electrode 173 and the drain electrode 175 of the polycrystalline transistor LTPS TFT, and the source electrode 177 and the drain electrode 179 of the oxide transistor Oxide TFT. The first passivation layer 181 may include an organic insulating material such as a general purpose polymer such as poly(methyl methacrylate) or polystyrene, a polymer derivative having a phenolic group, an acryl-based polymer, an imide polymer, a polyimide, an acryl-based polymer, and a siloxane-based polymer.

A second data conductive layer including a connection electrode 185 may be positioned on the first passivation layer 181. The second data conductor may have a single-layered or multi-layered structure. The second data conductor may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first passivation layer 181 may define openings therein overlapping the connection electrode 185 and the drain electrode 175 of the polycrystalline transistor LTPS TFT in a plan view. The connection electrode 185 may be connected to the drain electrode 175 of the polycrystalline transistor LTPS TFT through the opening.

A second passivation layer 182 may be positioned on the second data conductive layer including the connection electrode 185. A third passivation layer 183 may be positioned on the second passivation layer 182. The second passivation layer 182 and the third passivation layer 183 may include an organic insulating material such as a general purpose polymer such as poly(methyl methacrylate) or polystyrene, a polymer derivative having a phenolic group, an acryl-based polymer, an imide polymer, a polyimide, an acryl-based polymer, and a siloxane-based polymer. A separate conductive layer may or may not be positioned between the second passivation layer 182 and the third passivation layer 183. In some cases, the third passivation layer 183 may be omitted.

A light-emitting device ED may be positioned on the third passivation layer 183. The light-emitting device ED may be connected to the polycrystalline transistor LTPS TFT. The light-emitting device ED may include a pixel electrode 191, an emission layer 370, and a common electrode 270.

The pixel electrode 191 of the light-emitting device ED may be positioned on the third passivation layer 183. The third passivation layer 183 and the second passivation layer 182 may define openings therein overlapping the pixel electrode 191 and the connection electrode 185 in a plan view. The pixel electrode 191 of the light-emitting device ED may be connected to the connection electrode 185 through the opening. Accordingly, the pixel electrode 191 of the light-emitting device ED may be connected to the drain electrode 175 of the polycrystalline transistor LTPS TFT through the connection electrode 185.

A bank layer 350 may be positioned on the pixel electrode 191 of the light-emitting device ED. The bank layer 350 is also referred to as a pixel defining layer ("PDL"), and defines a pixel opening 351 overlapping at least a portion of the pixel electrode 191 in a plan view. In this case, the pixel opening 351 may overlap the central portion of the pixel electrode 191 and may not overlap the edge portion of the pixel electrode 191 in a plan view. Accordingly, the size of the pixel opening 351 may be smaller than the size of the pixel electrode 191. The bank layer 350 may be an organic insulator including at least one material selected from the group consisting of polyimide, polyamide, acryl resin, benzocyclobutene, and phenol resin. According to an embodiment, the bank layer 350 may be formed as a black pixel defining layer ("BPDL") including a black color pigment.

The pixel opening 351 may partition a formation position of the emission layer 370 so that the emission layer 370 may be positioned on the portion where the upper surface of the pixel electrode 191 is exposed. The emission layer 370 may include a plurality of layers, some of the plurality of layers may be formed only within the pixel opening 351, and the remaining portions may be formed not only within the pixel opening 351 but also on the bank layer 350. That is, some layers of the emission layer 370 can be entirely positioned over most of the area on the substrate 110.

The common electrode 270 may be positioned on the emission layer 370. The common electrode 270 may be entirely positioned in most areas on the substrate 110. The common electrode 270 is also called a cathode, and may be formed of a transparent conductive layer including Indium Tin Oxide ("ITO"), Indium Zinc Oxide ("IZO"), Indium Gallium Zinc Oxide ("IGZO"), and Indium Tin Zinc Oxide ("ITZO"). Also, the common electrode 270 may have a translucent characteristic, and in this case, it may constitute a micro-cavity together with the pixel electrode 191. According to the micro-cavity structure, light with a specific wavelength is emitted upwards by a gap and characteristics between both electrodes, and as a result red, green, or blue may be displayed.

The light-emitting device ED emits light around the area where the pixel electrode 191, the emission layer 370, and the common electrode 270 overlap in a plan view. Each light-emitting device ED may display at least one of a first color, a second color, and a third color. For example, the light-emitting device ED may display red, green, and blue.

An encapsulation layer 400 may be positioned on the common electrode 270. The encapsulation layer 400 may include at least one inorganic layer and at least one organic layer. In the present embodiment, the encapsulation layer 400 may include a first inorganic encapsulation layer 410, an organic encapsulation layer 420, and a second inorganic encapsulation layer 430. However, this is only an example, and the number of inorganic and organic layers constituting the encapsulation layer 400 may be variously changed. The encapsulation layer 400 is to protect the light-emitting element ED from moisture or oxygen that may flow in from the outside, and the ends of one side of the first inorganic encapsulation layer 410 and the second inorganic encapsulation layer 430 may be formed to be in direct contact.

The insulating layers such as the buffer layer 111, the first gate insulating layer 141, the second gate insulating layer 142, the first interlayer insulating layer 161, the third gate insulating layer 143, the second interlayer insulating layer 162, the first passivation layer 181, the second passivation layer 182, the third passivation layer 183, and the like may be positioned in the first area A1, and may not be positioned in the second area A2. The metal layer and the like such as the polycrystalline semiconductor layer, the first gate conductive layer, the second gate conductive layer, the oxide semiconductor layer, the third gate conductive layer, the first data conductive layer, the second data conductive layer, the light-emitting device ED, and the like may be positioned in the first area A1, and may not be positioned in the second area A2. However, some of these layers may be positioned in both the first area A1 and the second area A2. The encapsulation layer 430 may be positioned in both the first area A1 and the second area A2. In this case, a part of the encapsulation layer 430, for example, the organic encapsulation layer 420, may be positioned in the first area A1 and not in the second area A2. That is, in the second area A2, the first inorganic encapsulation layer 410 and the second inorganic encapsulation layer 430 may be positioned on the substrate 110.

Next, an operation process of the display device according to an embodiment is described with reference to FIG. 6 to FIG. 9.

Figure 6:
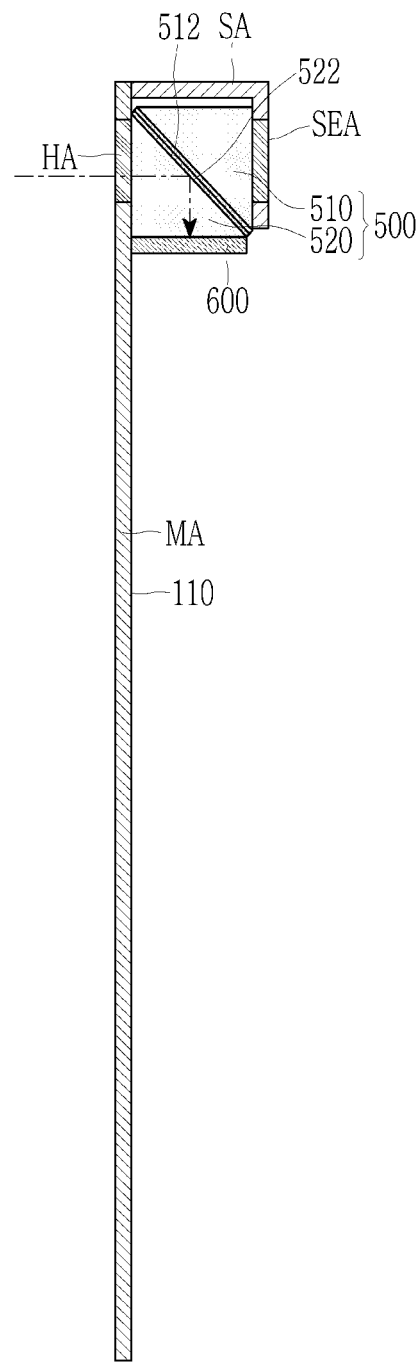
FIG. 6 is a schematic cross-sectional view of a display device according to an embodiment.
Figure 7:
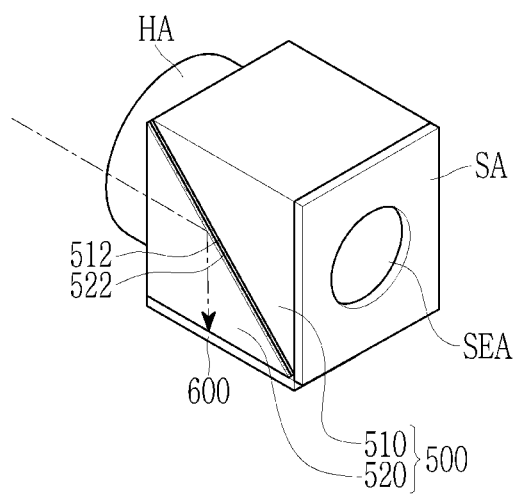
FIG. 7 is a perspective view showing some areas of a display device according to an embodiment.
Figure 8:
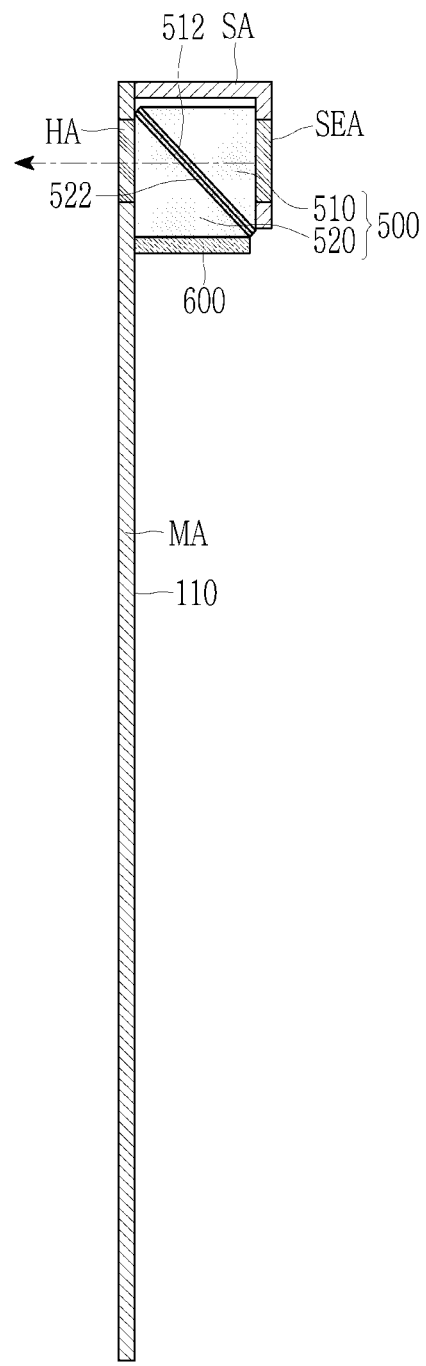
FIG. 8 is a schematic cross-sectional view of a display device according to an embodiment.
Figure 9:
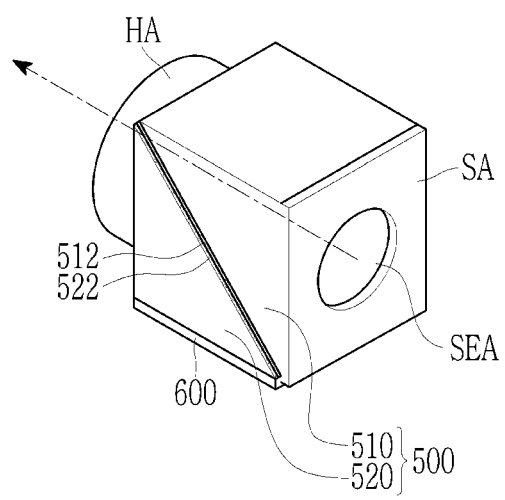
FIG. 9 is a perspective view showing some areas of a display device according to an embodiment.

FIG. 6 is a schematic cross-sectional view of a display device according to an embodiment, and FIG. 7 is a perspective view showing some areas of a display device according to an embodiment. FIG. 6 and FIG. 7 show when the display device according to an embodiment is operated in a reflection mode. FIG. 8 is a schematic cross-sectional view of a display device according to an embodiment, and FIG. 9 is a perspective view showing some areas of a display device according to an embodiment. FIG. 8 and FIG. 9 show when the display device according to an embodiment is operated in a transmission mode.

As shown in FIG. 6 and FIG. 7, the display device according to an embodiment may include the substrate 110, the light-emitting device, the prism 500, and the camera module 600. At this time, when the light-emitting device positioned in the sub-area SA of the substrate 110 is turned off and the camera module 600 is turned on, the display device according to an embodiment may be operated in a reflective mode. The light incident to the hole area HA of the substrate 110 may be incident to the second prism 520. The light incident on the second prism 520 may be reflected on the inclined surface of the second prism 520, and the light path may be changed. The light reflected on the inclined surface of the second prism 520 may pass through the lower surface of the second prism 520 and exit to the outside of the second prism 520, and may be incident on the camera module 600. Through this, the camera module 600 may photograph an external subject. Since the light-emitting device positioned in the sub-area SA is in the turned-off state, the image may not be displayed in the hole area HA.

As shown in FIG. 8 and FIG. 9, the display device according to an embodiment may include the substrate 110, the light-emitting device, the prism 500, and the camera module 600. At this time, when the light-emitting device positioned in the sub-area SA of the substrate 110 is turned on and the camera module 600 is turned off, the display device according to an embodiment may be operated in the transmission mode. The light emitted from the light-emitting device positioned in the sub-area SA may be incident on the first prism 510. The light incident on the first prism 510 may exit the first prism 510 and may be incident on the second prism 520. The light incident on the second prism 520 may exit the second prism 520, pass through the hole area HA of the substrate 110, and be emitted to the outside. Through this, the image may be displayed on the hole area HA. At this time, since the camera module 600 is in the off state, the photographing may not be performed.

In summary, when the light is not emitted from the sub-area SA positioned on the rear surface of the hole area HA, the light incident from the outside is reflected by the prism 500 and transmitted to the camera module 600 to be photographed. When the light is emitted from the sub-area SA, the light emitted from the light-emitting device may pass through the prism 500 and the hole area HA to display the image. In this case, the reflectance and transmittance of the light in the prism 500 may be determined by the material, the thickness, etc. of the coating layers 512 and 522. If the reflectance of the light increases, the transmittance may relatively decrease. Conversely, if the reflectance of light decreases, the transmittance may relatively increase. For example, the reflectance and transmittance of the light in the prism 500 may be adjusted between about 40% and about 60%. When the reflectance of the light is about 40%, the transmittance of the light may be about 60%. However, this is only an example, and the reflectance and transmittance of light in the prism 500 may be appropriately selected in consideration of the camera performance and the image quality in the hole area HA.

When the light-emitting device is formed in the hole area HA and the camera module is positioned on the rear surface of the hole area HA, the amount of the light passing through the hole area HA is greatly reduced by the insulating layers and the metal layers of the several layers positioned in the hole area HA. Also, if some pixels are omitted to improve the transmittance in the hole area HA, the resolution may be lowered. In the display device according to an embodiment, the transmittance of the hole area HA may be greatly improved by not forming most of the insulating layer and the metal layer on the hole area HA. Therefore, by increasing the amount of the light incident to the camera module 600, it is possible to improve the photographing performance. In addition, by forming the light-emitting device in the sub-area SA of the substrate 110 positioned on the back surface of the hole area HA, the transmittance of the hole area HA may not decrease even if the light-emitting device is formed with the same density as the main area MA. Therefore, it is possible to effectively improve the resolution in the hole area HA.

The light-emitting devices having the same or similar structures may be formed in the main area MA and the sub-area SA. As shown in FIG. 1, In the state where the substrate 110 is flat, that is, in the state where the main area MA and the sub-area SA are positioned on the same plane, each insulating layer and metal layer may be formed on the substrate 110 up to the encapsulation layer 400. That is, the light-emitting device positioned in the main area MA and the light-emitting device positioned in the sub-area SA may be simultaneously formed in the same process. Similarly, the transistor positioned in the main area MA and the transistor positioned in the sub-area SA may be simultaneously formed in the same process. Then, as shown in FIG. 2, the substrate 110 may be bent so that the sub-area SA is positioned on the rear surface of the main area MA. At this time, by forming the sub-emission area SEA to overlap the hole area HA in a plan view, the light emitted from the sub-emission area SEA may pass through the hole area HA. The display device according to an embodiment may be composed of a both-sided direction display device, a transparent display device, etc., and may be adjusted so that the light emitted from the sub-emission area SEA is directed to the main emission area MA.

Next, the display device according to another embodiment is described with reference to FIG. 10 and FIG. 11.

Figure 10:
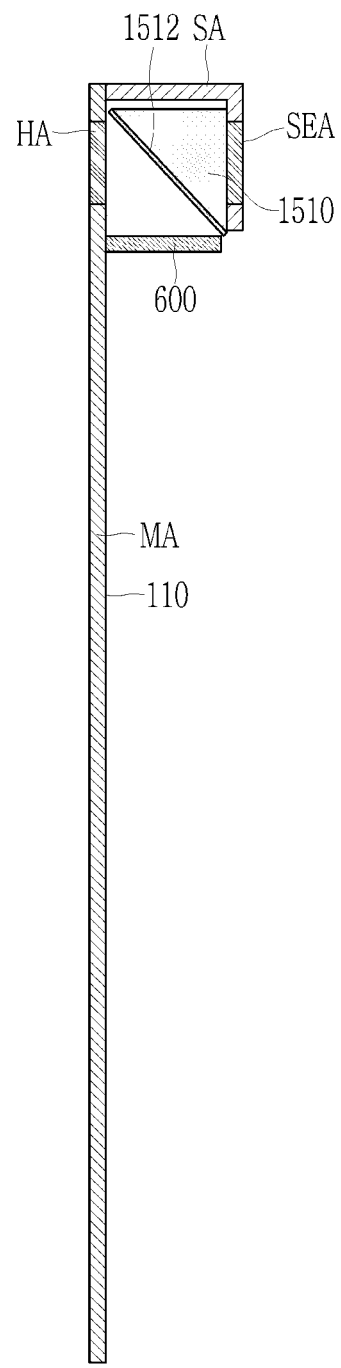
FIG. 10 is a schematic cross-sectional view of a display device according to another embodiment.
Figure 11:
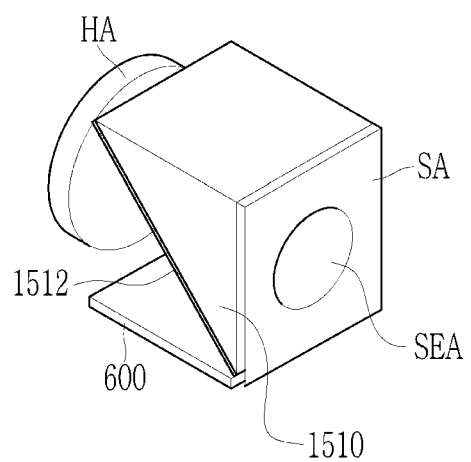
FIG. 11 is a perspective view showing some areas of a display device according to another embodiment.

The display device according to the embodiment shown in FIG. 10 and FIG. 11 includes the same parts as most of the display device according to the embodiment shown in FIG. 1 to FIG. 5, so the description of the same parts is omitted. The present embodiment of FIGS. 10 and 11 is different from the previous embodiment of FIGS. 1 to 5 in that the prism consists of a single prism, which is further described below.

FIG. 10 is a schematic cross-sectional view of a display device according to another embodiment, and FIG. 11 is a perspective view showing some areas of a display device according to the embodiment of FIG. 10.

As shown in FIG. 10 and FIG. 11, the display device according to an embodiment includes the substrate 110 including the main area MA and the sub-area SA, a plurality of light-emitting devices positioned on the substrate 110, the prism 1510 positioned between the main area MA and the sub-area SA of the substrate 110, and the camera module 600 positioned on one surface of the prism 1510.

In the preceding embodiment, a structure including a pair of prisms is shown, and in the present embodiment, a structure including a single prism 1510 is shown. That is, in the present embodiment, the first prism in the preceding embodiment remains and the second prism is omitted.

The prism 1510 may be surrounded by the substrate 110. Two surfaces of the prism 1510 may be disposed to be adjacent to the sub-area SA of the substrate 110. In this case, two surfaces may form a right angle with each other. One of two surfaces may be adjacent to the sub-emission area SEA of the sub-area SA, and the other may be adjacent to the sub-area SA excluding the sub-emission area SEA. The inclined surface of the prism 1510 may face the main area MA and the camera module 600 of the substrate 110.

The main area MA and the sub-area SA of the substrate 110 facing each other via the prism 1510 therebetween may be disposed side by side. When the light is not emitted from the sub-area SA positioned at the rear of the hole area HA, the light incident from the outside is reflected by the prism 1510 and transmitted to the camera module 600 to take pictures. When the light is emitted from the sub-area SA, the light emitted from the light-emitting device may pass through the prism 1510 and the hole area HA to display the image.

The display device according to an embodiment may further include a coating layer 1512 positioned on the prism 1510. The reflectance and transmittance of light in the prism 1510 may be determined by the material and thickness of the coating layer 1512.

Next, the display device according to still another embodiment is described with reference to FIG. 12 and FIG. 13.

Figure 12:
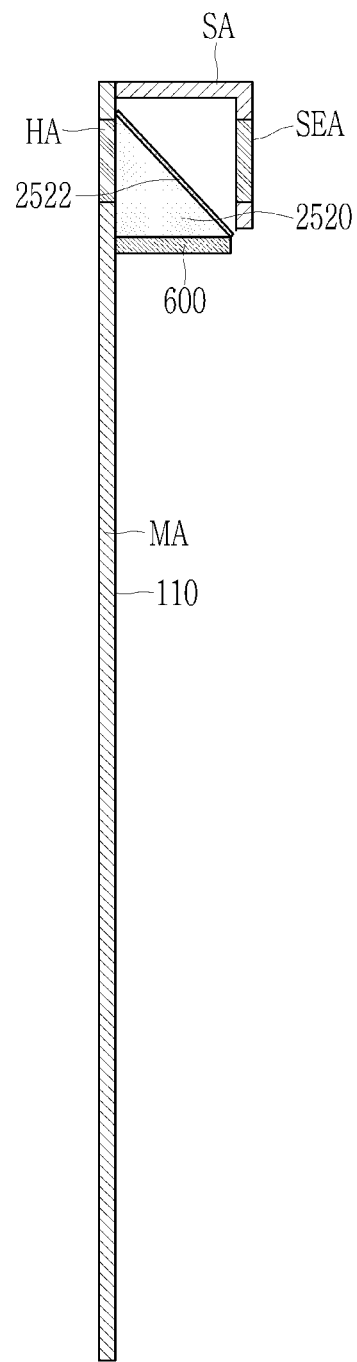
FIG. 12 is a schematic cross-sectional view of a display device according to still another embodiment.
Figure 13:
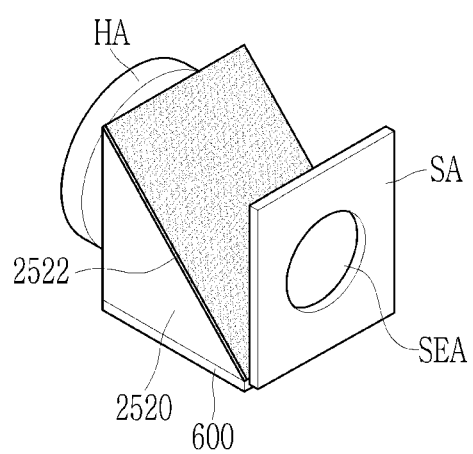
FIG. 13 is a perspective view showing some areas of a display device according to still another embodiment.

The display device according to the embodiment shown in FIG. 12 and FIG. 13 includes the same parts as most of the display device according to the embodiment shown in FIG. 1 to FIG. 5, so the description of the same parts is omitted. The present embodiment of FIGS. 12 and 13 is different from the previous embodiment of FIGS. 1 to 5 in that the prism consists of a single prism, which is further described below.

FIG. 12 is a schematic cross-sectional view of a display device according to still another embodiment, and FIG. 13 is a perspective view showing some areas of a display device according to the embodiment of FIG. 12.

As shown in FIG. 12 and FIG. 13, the display device according to an embodiment includes the substrate 110 including the main area MA and the sub-area SA, a plurality of light-emitting devices positioned on the substrate 110, the prism 2520 positioned between the main area MA and the sub-area SA of the substrate 110, and the camera module 600 positioned on one surface of the prism 1510.

In the preceding embodiment, a structure including a pair of prisms is shown, and in the present embodiment, a structure including a single prism 2520 is shown. That is, in the present embodiment, the second prism in the preceding embodiment remains and the first prism is omitted.

The prism 2520 may be surrounded by the substrate 110. One side of the prism 2520 may be disposed to be adjacent to the main area MA of the substrate 110. At this time, one side of the prism 2520 may be adjacent to the hole area HA defined in the main area MA of the substrate 110. The other side of the prism 2520 may be adjacent to the camera module 600. At this time, one side and the other side of the prism 2520 may form a right angle with each other. The inclined surface of the prism 2520 may face the sub-area SA of the substrate 110.

The main area MA and the sub-area SA of the substrate 110 facing each other with the prism 2520 interposed therebetween may be disposed side by side. When light is not emitted from the sub-area SA positioned at the rear of the hole area HA, the light incident from the outside is reflected by the prism 2520 and transmitted to the camera module 600, so that the photographing may be performed. When light is emitted from the sub-area SA, the light emitted from the light-emitting device may pass through the prism 2520 and the hole area HA to display the image.

The display device according to an embodiment may further include a coating layer 2522 positioned on the prism 2520. The reflectance and transmittance of light in the prism 2520 can be determined by the material and thickness of the coating layer 2522. Next, the display device according to yet another embodiment is described with reference to FIG. 14 as follows.

Figure 14:
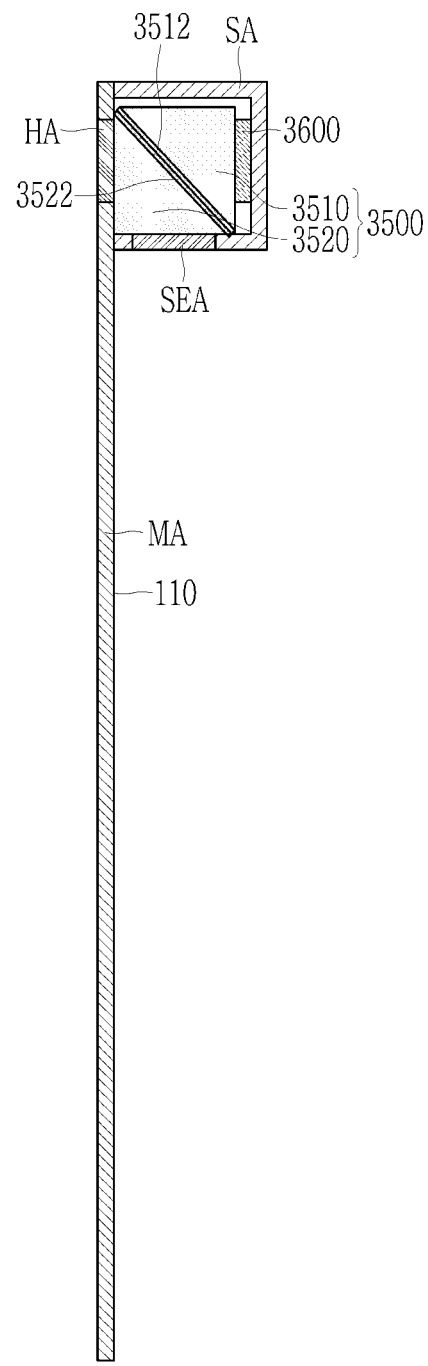
FIG. 14 is a schematic cross-sectional view of a display device according to yet another embodiment.

The display device according to the embodiment shown in FIG. 14 includes the same parts as most of the display device according to the embodiment shown in FIG. 1 to FIG. 5, so the description of the same parts is omitted. In the present embodiment, the position of the camera module and the sub-emission area is different from the previous embodiment, which is further described below.

FIG. 14 is a schematic cross-sectional view of a display device according to yet another embodiment.

As shown in FIG. 14, the display device according to the embodiment includes the substrate 110 including the main area MA and the sub-area SA, a plurality of light-emitting devices positioned on the substrate 110, the prism 3500 positioned between the main area MA and the sub-area SA of the substrate 110, and the camera module 3600 positioned on one surface of the prism 3500.

In the preceding embodiment of FIGS. 1 to 5, the sub-emission area SEA may be positioned at the back of the hole area HA and overlap each other, and in the present embodiment, the sub-emission area SEA does not overlap the hole area HA in a plan view. In the present embodiment, the position of the camera module 3600 and the sub-emission area SEA may be reversed from the previous embodiment of FIGS. 1 to 5.

In the present embodiment, the sub-area SA is further expanded compared to the previous embodiment and wraps up to the lower side of the prism 3500. The sub-emission area SEA is positioned adjacent to the lower surface of the prism 3500. The camera module 3600 is positioned on the back surface of the hole area HA. The camera module 3600 may overlap the hole area HA in a plan view.

The prism 3500 may be surrounded by the substrate 110. The prism 3500 may include a first prism 3510 and a second prism 3520. The inclined surface of the first prism 3510 and the inclined surface of the second prism 3520 may be positioned to face each other. Two surfaces of the first prism 3510 can be disposed adjacent to the sub-area SA of the substrate 110. In this case, two surfaces may form a right angle with each other. Two surfaces may be adjacent to the sub-area SA except for the sub-emission area SEA. One of the two surfaces may be adjacent to the camera module 3600. One surface of the second prism 3520 may be disposed to be adjacent to the main area MA of the substrate 110. In this case, one side of the second prism 3520 may be adjacent to the hole area HA positioned in the main area MA of the substrate 110. The other surface of the second prism 3520 may be adjacent to the sub-emission area SEA positioned within the sub-area SA. At this time, one surface and the other surface of the second prism 520 may form a right angle with each other.

The main area MA and the sub-area SA of the substrate 110 facing each other with the prism 3500 in between may be disposed side by side. When the light-emitting device positioned in the sub-emission area SEA does not emit light, the light incident from the outside passes through the prism 3500 and is transmitted to the camera module 3600 to take pictures. When light is emitted from the light-emitting device positioned in the sub-emission area SEA, the light may pass through the prism 3500 and the hole area HA to display the image.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

110: substrate
500: prism
510: first prism
512: first coating layer
520: second prism
522: second coating layer
600: camera module

What is claimed is:

1. A display device comprising:
a substrate including a main area and a sub-area overlapping each other in a plan view;
a plurality of light-emitting devices positioned on the main area and the sub-area of the substrate;
a prism positioned between the main area and the sub-area; and
a camera module positioned on one surface of the prism, wherein the substrate further includes:
a hole area defined in the main area; and
a sub-emission area positioned in the sub-area and on another surface of the prism,
wherein the prism is disposed to overlap the hole area in the plan view.

2. The display device of claim 1,
wherein first light-emitting devices positioned on the sub-area among the plurality of light-emitting devices overlap the hole area in the plan view.

3. The display device of claim 2, wherein
in the sub-area, the first light-emitting devices are positioned only within the sub-emission area.

4. The display device of claim 2, wherein
second light-emitting devices positioned on the main area among the plurality of light-emitting devices are not positioned in the hole area.

5. The display device of claim 2, further comprising
a transistor connected to each of the plurality of light-emitting devices, and
the transistor and each light-emitting device include a plurality of metal layers and a plurality of insulating layers positioned between a plurality of metal layers.

6. The display device of claim 5, wherein
a plurality of metal layers and a plurality of insulating layers are not positioned in the hole area.

7. The display device of claim 5, wherein
a plurality of metal layers and a plurality of insulating layers are not positioned in the sub-area except for the sub-emission area.

8. The display device of claim 5, wherein
second light-emitting devices positioned in the main area among the plurality of light-emitting devices and the first light-emitting devices positioned in the sub-area are simultaneously formed in the same process, and
the transistor positioned in the main area and the transistor positioned in the sub-area are simultaneously formed in the same process.

9. The display device of claim 5, wherein
a density of second light-emitting devices positioned in the main area among the plurality of light-emitting devices and a density of the first light-emitting devices positioned in the sub-area are the same.

10. The display device of claim 2, wherein
the prism includes a first prism and a second prism,
the first prism and the second prism each include a first surface, a second surface, and an inclined surface, and
the inclined surface of the first prism and the inclined surface of the second prism are disposed to face each other.

11. The display device of claim 10, wherein
the first surface of the first prism is adjacent to the sub-area except for the sub-emission area, and
the second surface of the first prism is adjacent to the sub-emission area.

12. The display device of claim 10, wherein
the first surface of the second prism is adjacent to the main area of the substrate, and
the second surface of the second prism is adjacent to the camera module.

13. The display device of claim 10, further comprising
a coating layer positioned between the first prism and the second prism.

14. The display device of claim 13, wherein
the coating layer includes
a first coating layer positioned on the inclined surface of the first prism, and
a second coating layer positioned on the inclined surface of the second prism.

15. The display device of claim 13, wherein
the coating layer includes a reflective metal material.

16. The display device of claim 2, wherein
when the first light-emitting devices positioned in the sub-emission area are turned off and the camera module is turned on,
light incident on the hole area passes through the prism and is incident on the camera module.

17. The display device of claim 2, wherein
when the first light-emitting devices positioned in the sub-emission area are turned on and the camera module is turned off,
light emitted from the first light-emitting devices sequentially pass through the prism and the hole area.

18. The display device of claim 2, wherein
the prism includes a first surface, a second surface, and an inclined surface, the first surface of the prism is adjacent to the sub-area except for the sub-emission area, the second surface of the prism is adjacent to the sub-emission area, and the inclined surface of the prism faces the main area and the camera module.

19. The display device of claim 2, wherein the prism includes a first surface, a second surface, and an inclined surface, the first surface of the prism is adjacent to the main area of the substrate, the second surface of the prism is adjacent to the camera module, and the inclined surface of the prism faces the sub-area.

20. The display device of claim 1, wherein the substrate includes a hole area defined within the main area and a sub-emission area positioned within the sub-area, wherein the camera module overlaps the hole area, and the sub-emission area is positioned adjacent to a lower side of the prism.

\* \* \* \* \*